United States Patent [19]

Pradal

[11] 4,139,826
[45] Feb. 13, 1979

[54] CRYSTAL OVERTONE OSCILLATOR USING CASCADE CONNECTED TRANSISTORS

[75] Inventor: Bortolo M. Pradal, Pittsburgh, Pa.

[73] Assignee: RCA Corporation, New York, N.Y.

[21] Appl. No.: 864,749

[22] Filed: Dec. 27, 1977

[51] Int. Cl.² .............................................. H03B 5/36
[52] U.S. Cl. ................................ 331/116 R; 331/159; 331/177 V
[58] Field of Search ............... 331/116 R, 177 V, 159; 332/26, 30 V

[56] References Cited

U.S. PATENT DOCUMENTS

| 3,258,720 | 6/1966 | Tartas | 331/116 R |
|---|---|---|---|
| 3,324,415 | 6/1967 | Sheffet | 331/116 R X |
| 3,512,107 | 5/1970 | Miyake et al. | 331/116 R |
| 3,845,410 | 10/1974 | Steel | 331/116 R |
| 3,875,533 | 4/1975 | Irwin et al. | 331/116 R |

Primary Examiner—Siegfried H. Grimm
Attorney, Agent, or Firm—Eugene M. Whitacre; Paul J. Rasmussen; Robert L. Troike

[57] ABSTRACT

An overtone oscillator of the feedback type is provided by a transistor, a crystal resonant at a fundamental frequency and higher odd overtone frequencies, and a feedback circuit that includes the crystal, a second transistor connected in cascade with the first transistor and an RC network. This feedback circuit provides the correct phase shift to achieve and sustain oscillations at the desired overtone frequency.

7 Claims, 1 Drawing Figure

U.S. Patent
Feb. 13, 1979
4,139,826
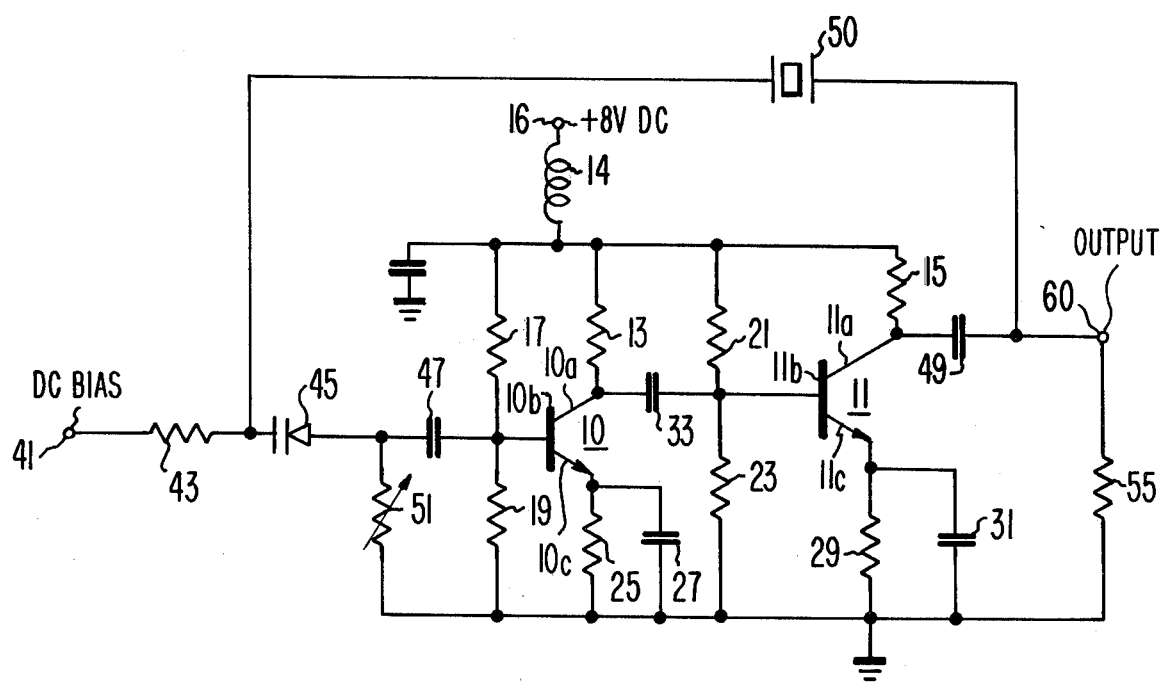

CRYSTAL OVERTONE OSCILLATOR USING CASCADE CONNECTED TRANSISTORS

BACKGROUND OF THE INVENTION

This invention relates generally to oscillators and, more particularly, to crystal controlled overtone oscillator circuits having means for assuring that the oscillator operates at a desired overtone frequency.

Overtone oscillators are well known in the prior art. The prior art overtone oscillators usually have adjustable inductances in the feedback path to prevent oscillation at lower overtone frequency and achieve the additional phase shift at the overtone frequency. See for example Irwin et al U.S. Pat. No. 3,875,533. The use of the inductance in the feedback introduces a temperature drift since a typical adjustable coil drifts about 400 ppm (parts per million) per degree celsius. It is therefore desirable to provide an overtone oscillator without the use of this feedback coil.

Although overtone oscillators of the negative resistance type as described in U.S. Pat. No. 3,512,107 of Miyake et al do not use an inductance, such circuits operate on the negative resistance principle and only at frequencies below 20 MHz with a narrow operating frequency range. The negative resistance type oscillator is very sensitive to multiple oscillation or frequency jumping between fundamental and overtone modes and/or at crystal spurious frequencies.

SUMMARY OF THE INVENTION

Briefly, an overtone oscillator without using an inductance coil or operating in the negative resistance region is provided by a first transistor and a second transistor and a crystal with the second transistor connected in cascade to the output of the first transistor and the crystal having a natural resonance at a fundamental frequency connected between the collector output of the second transistor and the base input of the first transistor. The second transistor provides additional gain and phase shift to the base input of the first transistor to provide oscillation at the desired overtone frequency. The transistors are biased as amplifiers for providing peaked gain at the desired overtone frequency.

DESCRIPTION OF DRAWING

The sole FIGURE is a schematic drawing of the oscillator according to one embodiment of the present invention.

DESCRIPTION OF THE INVENTION

Referring to the FIGURE, a transistor 10 is coupled in cascade with transistor 11. The collector 10a of transistor 10 is coupled via resistor 13 and an isolating impedance or choke 14 to a D.C. power supply at terminal 16. Similarly, the collector 11a of transistor 11 is coupled via resistor 15 to the same D.C. source. The base bias for transistor 10 is provided by the voltage dividing resistors 17 and 19. Similarly, the D.C. bias to the base 11b of transistor 11 is provided by voltage dividing resistors 21 and 23. The emitter 10c of transistor 10 is coupled to ground or reference potential via resistor 25. This resistor 25 is bypassed by a capacitor 27. Similarly, the emitter 11c of transistor 11 is coupled thru a resistor 29 to ground or reference potential and has a bypass capacitor 31 coupled thereacross. The signal at the collector 10a of transistor 10 is coupled via coupling capacitor 33 to the base 11b of transistor 11. The two cascade connected transistor stages 10 and 11 have current negative feedback determined by the value of the resistors 25 and 29 and the capacitances 27 and 31 coupled thereacross. The output signal at the collector 11a of transistor 11 is coupled via coupling capacitor 49 to the output terminal 60. Positive feedback for the oscillator is provided via the crystal 50 to the input terminal of varactor diode 45. Sufficient gain is provided by the transistor stages 10 and 11 to enable oscillation at the desired overtone frequency. A resistor 51 is coupled between the anode terminal of varactor 45 and ground or reference potential. The value of the resistance of resistor 51 together with the capacitance of the varactor 45 is adjusted such that at the desired overtone frequency there is exactly 360° phase shift between the collector of transistor 10 and the input at the base of transistor 10. The value of the capacitance of varactor 45 is determined by the D.C. voltage applied at the input terminal 41. Alternatively resistor 51 can be made variable to extend the tuning range of the circuit and/or to adjust crystal frequency. Cascade connected transistor 11 provides about an extra 180° phase shift. The crystal 50 is designed at a selected given fundamental frequency. For the example this frequency is about 13 MHz. The value of resistor 51 together with the capacitance of varactor 45 is adjusted such that at for example the third overtone frequency of 39 MHz, there is exactly 360° phase shift. In addition, the capacitance values at the emitters of transistor stages 10 and 11 — the values of capacitors 27 and 31 in the FIGURE — are adjusted such as to provide peaking of the amplification at the desired overtone frequency and to provide insufficient gain and lesser phase shift because of the current negative feedback at the fundamental frequency. Further, the value of the A.C. load resistances (load resistor 55) are adjusted to provide peaking at the overtone frequency. Input signals to be modulated are applied to the oscillator at input terminal 41. These input signals are applied via resistor 43 to varactor diode 45. These signals are then coupled via coupling capacitor 47 to the base 10b of transistor 10. For example, in the above described arrangement when operating a crystal with the fundamental frequency at 13 MHz, the circuit had the following parameters:

Transistors 10, 11 = 2 N2857
Resistors 17, 21 = 11K Ω
Resistors 19, 23 = 10K Ω
Resistor 13 = 1K Ω
Resistor 15 = 1.5K Ω
Load resistor 55 = 50 Ω
For the third overtone resistor 51 = 877Ω with capacitor 27 being 110 pF.
Resistor 29 = 1K Ω
Capacitor 31 = 560 pF
Varactor 45 = type KV2002 varactor diode sold by KSW Electronics of Burlington, Mass., with the D.C. biasing level thereto being +5 D.C. thru a 100K Ω resistor 43. The D.C. voltage at the biasing terminal 16 is +8 V D.C. For the fifth overtone, the resistance of resistor 51 is selected to be 47 Ω and the capacitor 27 is 68 pF. A variable resistor, electronically controlled such as FET transistor, or a manually adjustable resistor, can replace resistor 51 to tune the desired overtone.

What is claimed is:
1. An overtone crystal oscillator comprising:
  a first transistor including a base, emitter and collector electrodes, a crystal having natural resonances at a fundamental frequency and higher odd overtone frequencies, feedback means including a second transistor and said crystal connected in series between the collector electrode of said first transistor and the base of said first transistor for providing sufficient gain and phase shift at a selected overtone frequency to achieve oscillation at the overtone frequency, said second transistor providing about 180° additional phase shift at the desired overtone frequency.

means coupled to the electrodes of said first and second transistors for biasing said first and second transistor as an amplifier, said biasing means including current negative feedback means for peaking the gain at the desired overtone frequency.

2. The combination of claim 1 wherein said feedback means further includes a capacitor and resistor connected in series for peaking the gain and providing additional phase shift at the desired overtone frequency.

3. The combination of claim 2 wherein said capacitor is an adjustable capacitor.

4. The combination of claim 3 wherein said adjustable capacitor is a varactor.

5. The combination of claim 2 wherein said resistor is adjustable.

6. The combination of claim 1 wherein said second transistor has its base electrode coupled to the collector of said first transistor and its collector electrode coupled to said crystal.

7. An overtone crystal oscillator comprising:

first and second transistors with the second transistor connected in cascade to the output of the first transistor, means for biasing said transistors as amplifiers, a piezoelectric crystal having natural resonances at the fundamental and the odd overtone frequencies, an RC network coupled to the base of said first transistor for peaking the gain and the phase at the desired overtone frequency, said crystal connected between the collector output of the second transistor and the RC network for together with the RC network and the second transistor providing feedback with sufficient gain and phase shift to the base of the first transistor to achieve oscillation at the desired overtone frequency, said biasing means including current negative feedback means for peaking the gain at the desired overtone frequency.

* * * * *